(12) United States Patent
Feng et al.

(10) Patent No.: US 7,724,103 B2
(45) Date of Patent: May 25, 2010

(54) ULTRA-HIGH FREQUENCY SELF-SUSTAINING OSCILLATORS, COUPLED OSCILLATORS, VOLTAGE-CONTROLLED OSCILLATORS, AND OSCILLATOR ARRAYS BASED ON VIBRATING NANOELECTROMECHANICAL RESONATORS

(75) Inventors: Xiao-Li Feng, Pasadena, CA (US); Christopher J. White, Palo Alto, CA (US); Seyed Ali Hajimiri, Pasadena, CA (US); Michael L. Roukes, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 85 days.

(21) Appl. No.: 12/030,815

(22) Filed: Feb. 13, 2008

(65) Prior Publication Data

US 2008/0204152 A1    Aug. 28, 2008

Related U.S. Application Data

(60) Provisional application No. 60/901,566, filed on Feb. 13, 2007.

(51) Int. Cl.
*H03B 5/42* (2006.01)
*H03B 5/30* (2006.01)
*G01M 7/00* (2006.01)

(52) U.S. Cl. ............. 331/154; 331/156; 331/138; 73/580

(58) Field of Classification Search ............. 331/116 M, 331/116 R, 154, 155, 156, 55, 177 R, 34; 73/579, 580, 504.12
See application file for complete search history.

(56) References Cited

U.S. PATENT DOCUMENTS

| 5,946,795 A | * | 9/1999 | Altemir ................. 29/602.1 |
| 6,722,200 B2 | * | 4/2004 | Roukes et al. ............ 73/580 |
| 2002/0050865 A1 | * | 5/2002 | Gitsevich et al. ........... 331/99 |

OTHER PUBLICATIONS

Han, et al., "A Novel Voltage-Controlled Oscillator Realized with a Microresonator", Jan. 2005, Solid State Electronics, vol. 49, Issue 1, pp. 63-66.*
Reppert et al., "Coordination of circadian timing in mammals," Nature, vol. 418, Aug. 29, 2002, pp. 935-941.
Celik et al., "Shear layer oscillation along a perforated surface: a self-excited large-scale instability," Physics of Fluids, vol. 14, No. 12, Dec. 2002, pp. 4444-4447.
Andronow, "Poincare limit cycles and the theory of self-sustaining oscillations," Comptes rendus de l'Academie des Sciences, vol. 189, 1929, pp. 559-561.

(Continued)

*Primary Examiner*—Robert Pascal
*Assistant Examiner*—Ryan J Johnson
(74) *Attorney, Agent, or Firm*—Gates & Cooper LLP (57) ABSTRACT

A self-sustaining ultra-high frequency oscillator and method enable the ability to oscillate and output a signal. A balanced bridge circuit is utilized to null an embedding background response. A first vibrating nanoelectromechanical (NEMS) beam resonator is part of one of the branches of the balanced bridge circuit and determines the frequency of the oscillator's output signal. A feedback loop establishes and sets oscillation conditions of the oscillator's signal. Further, the feedback loop connects an output of the first resonator to an input of the balanced bridge circuit.

22 Claims, 10 Drawing Sheets

OTHER PUBLICATIONS

Hajimiri et al., "The Design of Low Noise Oscillators," Chapter 2 Boston: Kluwer, 1999, pp. 5-29.

Ward et al., "In situ interfacial mass detection with piezoelectric transducer," Science, New Series, vol. 249, No. 4972, Aug. 31, 1990, pp. 1000-1007.

Knappe et al., "A microfabricated atomic clock," Applied Physics Letters, vol. 85, No. 9, Aug. 30, 2004, pp. 1460-1462.

Thompson, "The development of the quartz crystal oscillator industry of world war II," IEEE Transactions of Ultrasonics, Ferroelectrics, and Frequency Control, vol. 52, No. 5, May 2005, pp. 694-697.

Nguyen, "Frequency-selective MEMS for miniaturized low-power communication devices," IEEE Transactions on Microwave Theory and Techniques, vol. 47, No. 8, Aug. 1999, pp. 1486-1503.

Newell, "Miniaturization of tuning forks," Science, vol. 161, Sep. 27, 1968, pp. 1320-1326.

Huang et al.,"Nanodevice motion at microwave frequencies," Nature, vol. 421, Jan. 30, 2003, p. 496 and figure.

Huang et al., "VHF, UHF and microwave frequency nanomechanical resonators," New Journal of Physics 7 (2005) 247, pp. 1-15, Nov. 2005.

Lin et al., "Series-resonant VHF micromechanical resonator reference oscillators," IEEE Journal of Solid-State Circuit, vol. 39, No. 12, Dec. 2004, pp. 2477-2491.

Husain et al., "Nanowire-based very-high-frequency electromechanical resonator," Applied Physics Letters, vol. 83, No. 6, Aug. 11, 2003, pp. 1240-1242.

Sazonova et al., "A tunable carbon nanotube electromechanical oscillator," Nature, vol. 431, Sep. 16, 2004, pp. 284-287.

Lewis, "An introduction to frequency standards," Proceedings of the IEEE, vol. 79, No. 7, Jul. 7, 1991, pp. 927-935.

Ekinci et al., "Balanced electronic detection of displacement in nanoelectrochemical systems," Applied Physics Letters, vol. 81, No. 12, Sep. 16, 2002, pp. 2253-2255.

Wang et al., "1.156-GHz self-aligned vibrating micromechanical disk resonator," IEEE Transactions on Ultrasonics, Ferroelectrics, and Frequency Control, vol. 51, No. 12, Dec. 2004, pp. 1607-1628.

Vig et al., "Noise in microelectromechanical system resonators," IEEE Transactions on Ultrasonics, Ferroelectrics, and Frequency Control, vol. 46, No. 6, Nov. 1999, pp. 1558-1565.

Ekinci et al., "Ultimate limits to inertial mass sensing based upon nanoelectromechanical systems," Journal of Applied Physics, vol. 95, No. 5, Mar. 1, 2004, pp. 2682-2689.

Yang et al., "Zeptogram-scale nanomechanical mass sensing," Nano Letters, vol. 6, No. 4, Apr. 2006, pp. 583-586.

Ham et al., "Virtual damping and einstein relation in oscillators," IEEE Journal of Solid-State Circuits, vol. 38, No. 3, Mar. 2003, pp. 407-418.

Leeson, "A simple model of feedback oscillator noise spectrum," Proceedings Letters, vol. 54, 1966, pp. 329-330.

Cleland et al., "Noise processes in nanomechanical resonators," Journal of Applied Physics, vol. 92, No. 5, Sep. 1, 2002, pp. 2758-2769.

Postma et al., "Dynamic range of nanotube- and nanowire-based electromechanical systems," Applied Physics Letters, 86, (2005), pp. 223105-1-223105-3.

Allan, "Statistics of atomic frequency standards," Proceedings of the IEEE, vol. 54, No. 2, Feb. 1966, pp. 221-230.

Feng, "Ultra-high frequency nanoelectromechanical systems with low-noise technologies for single-molecule mass sensing," Thesis, California Institute of Technology, 2006, pp. 89-116, Aug. 2006.

Wu et al., "Boiassay of prostate-specific antigen (PSA) using microcantilevers," Nature Biotechnology, vol. 19, Sep. 2001, pp. 856-860.

McKendry et al., "Multiple label-free biodetection and quantitative DNA-binding assays on a nanomechanical cantilever array," PNAS, vol. 99, No. 15, Jul. 23, 2002, pp. 9783-9788.

Backmann et al., "A label-free immunosensor array using single-chain antibody fragments," PNAS, vol. 102, No. 41, Oct. 11, 2005, pp. 14587-14592.

LaHaye et al., "Approaching the quantum limit of a nanomechanical resonator," Science, vol. 304, Apr. 2, 2004, pp. 74-77.

Schwab et al., "Putting mechanics into quantum mechanics," Physics Today, Jul. 2005, pp. 36-42.

Rokhsari et al., "Radiation-pressure-driven micro-mechanical oscillator," Optics Express, vol. 13, No. 14, Jul. 11, 2005, pp. 5293-5301.

Hajimiri et al., "Integrated phased array systems in silicon," Proceedings of the IEEE, vol. 93, No. 9, Sep. 2005, pp. 1637-1655.

* cited by examiner

ULTRA-HIGH FREQUENCY SELF-SUSTAINING OSCILLATORS, COUPLED OSCILLATORS, VOLTAGE-CONTROLLED OSCILLATORS, AND OSCILLATOR ARRAYS BASED ON VIBRATING NANOELECTROMECHANICAL RESONATORS

CROSS-REFERENCE TO RELATED APPLICATIONS

This application claims the benefit under 35 U.S.C. Section 119(e) of the following and commonly-assigned U.S. provisional patent application(s), which is/are incorporated by reference herein:

Provisional Application Ser. No. 60/901,566, filed on Feb. 13, 2007, by Philip Xiao-Li Feng, Christopher J. White, Seyed Ali Hajimiri, and Michael L. Roukes, entitled "ULTRA-HIGH FREQUENCY SELF-SUSTAINING OSCILLATORS, COUPLED OSCILLATORS, VOLTAGE-CONTROLLED OSCILLATORS, AND OSCILLATOR ARRAYS BASED ON VIBRATING NANOMECHANICAL RESONATORS".

STATEMENT REGARDING FEDERALLY SPONSORED RESEARCH AND DEVELOPMENT

The U.S. Government has certain rights in this invention pursuant to Grant No. N66001-02-1-8914 awarded by the NAVY-SPAWAR Systems Center San Diego.

BACKGROUND OF THE INVENTION

1. Field of the Invention

The present invention relates generally to oscillators, and in particular, to a method, apparatus, and article of manufacture for utilizing stable, low-noise, self-sustaining active oscillators operating at ultra-high frequency, based upon vibrating nanoelectromechanical resonators (NEMS resonators).

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

Self-sustaining oscillators possess the unique property of spontaneously generating periodically occurring events and sustaining these oscillations by extracting energy from non-periodic sources. They exist in nature in many fields ranging from biological circadian rhythms [1] to fluids flows [2] and dynamic systems [3]. They also find important applications in human-enabled systems such as navigation and communication [4], sensors and transducers [5], clocks and timekeeping [6], where the technological progresses have mainly been driven to attain ultrafast (wide bandwidth) operation, high-precision, low-power and ultrahigh integration densities. Over the years it is proven that stable oscillators based on mechanical resonators made from high-quality crystals [7] are excellent solutions for the aforementioned applications. A recent thrust seeks to develop oscillators based on micro- and nanoscale vibrating mechanical devices [8].

Despite the great impetus and efforts in miniaturizing mechanical resonators, following that of the electronics for some 40 years [9], there have been formidable challenges for realizing self-sustaining oscillators with crystalline mechanical devices at the micro and nanoscale. While the operating frequencies have been remarkably scaled up into the regimes well beyond those of conventional crystal oscillators, by exploiting advanced nanofabrication techniques to keep shrinking the dimensions of these micro and nanodevices [10, 11], their electromechanical characteristics (usually described by equivalent circuit models) become increasingly incongruous with readout electronics, and the devices response signal levels decrease drastically [10, 11, 12]. For example, hitherto the state-of-the-art microelectromechanical system (MEMS) oscillators have only been realized at frequencies as high as ~60 MHz [12]. Meanwhile, recently reported nanoelectromechanical system (NEMS) resonators made from both lithographically-patterned nanobeams [10, 11] and chemically-synthesized nanowires [13] and nanotubes [14], although operatable at very-high and ultra-high frequencies (VHF and UHF), all are passive resonators.

Accordingly, what is needed is a high frequency, self-sustaining, active oscillator with practical complexity and functionality.

SUMMARY OF THE INVENTION

A method, apparatus, and article of manufacture provide stable, low-noise, self-sustaining active oscillators operating at ultra-high frequency, based upon vibrating nanoelectromechanical resonators (NEMS resonators). Low-loss nanomechanical resonator devices fabricated from high-quality single-crystal silicon carbide (SiC or other materials) are excited into flexural vibrating modes and resonances are detected with very large resonance response signals and deeply nulled parasitics, utilizing high-resolution readout circuitry engineered and optimized for nanodevices. Stable self-sustaining oscillation is realized using the ultra-high frequency nanomechanical resonator as the frequency-determining element embedded in a low-noise feedback control loop. Such NEMS oscillators operate at unprecedentedly high frequencies at fundamental modes (tunes) as compared to conventional quartz crystal oscillators, and are many orders of magnitude smaller in volume. The demonstrated active NEMS oscillator exhibits noteworthy frequency stability and noise performance, and may enable ultrasensitive resonant sensing, timing, signal processing and communication applications, as well as methodologies and instruments for fundamental physics and biology. By elaborate engineering, the NEMS oscillators can be readily extended to coupled oscillators, voltage-controlled oscillators, and oscillator arrays for various more advanced applications.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

For the emerging nanodevices to fulfill their potentials, active oscillators are desirable and remain an open challenge. One or more embodiments of the invention demonstrates a low-noise, stable, active oscillator based on a vibrating UHF NEMS resonator, and a detailed characterization of its system-level performance. The NEMS oscillator of the invention is the highest frequency oscillator reported among all MEMS and NEMS devices made from crystalline materials, vibrating at their fundamental flexural modes. Compared to many other rudimentary nanodevices prototypes, the invention is among the first nanodevice-embedded systems with practical complexity and functionality; and it demonstrates considerable potentials for radio-frequency (RF) nanomechanical transducers and signal processing applications. Such properties help approach the limits of ultimately miniaturizing crystal oscillators.

Self-Sustaining NEMS Oscillator

Figure 1A:
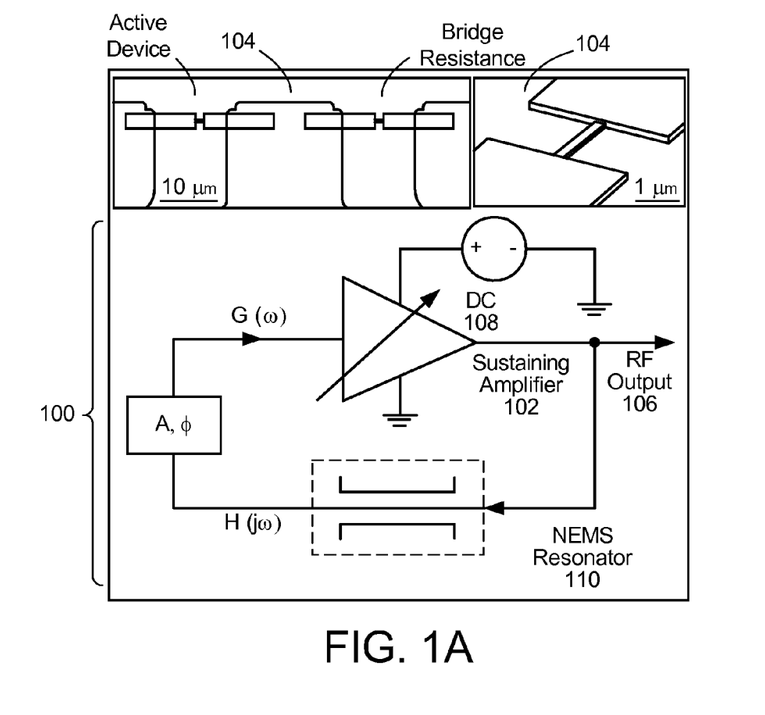
FIGS. 1A-1D demonstrate the UHF NEMS oscillator in accordance with one or more embodiments of the invention.

One or more embodiments of the invention provide a self-sustaining NEMS Oscillator. FIGS. 1A-1D demonstrate the UHF NEMS oscillator in accordance with one or more embodiments of the invention. FIG. 1A illustrates a schematic (i.e., for an oscillator 100) of the simplified circuit diagram for self-oscillation, with feedback and sustaining amplifier 102. Scanning electron microscope images 104 illustrate a UHF nanomechanical resonator and the bridge configuration from which the large signal is detected.

Figure 1B:
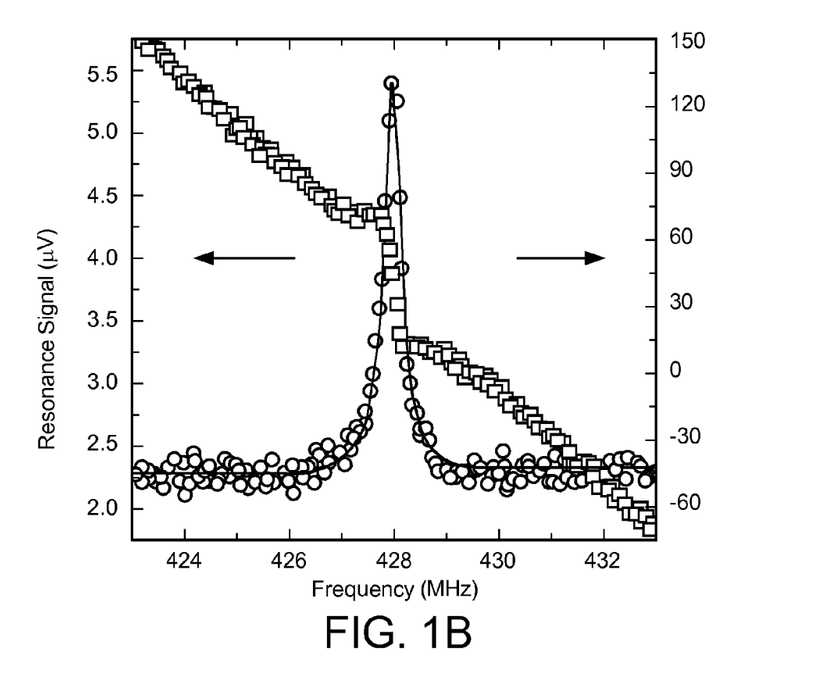

FIG. 1B illustrates a resonance signal from the 428 MHz NEMS resonator which serves as the frequency determining element of the oscillator. The resonance signal is accurately measured with a calibrated microwave network analyzer. Resonance signal-to-background ratio (RSBR) of 8 dB is achieved. The solid line is from the Lorentzian fit to the resonance.

Figure 1C:
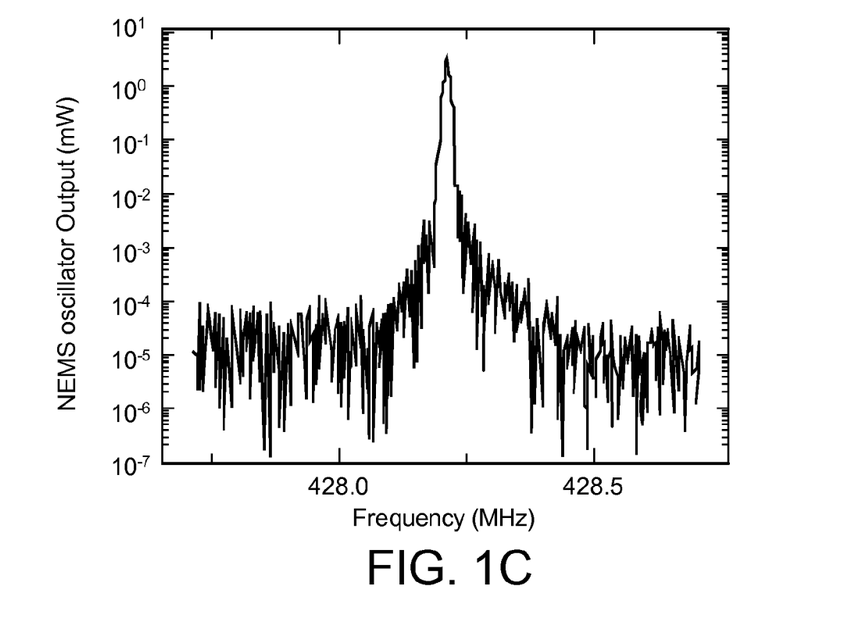

FIG. 1C illustrates a power spectrum of stable self-oscillation of the NEMS oscillator with peak output power 5 dBm, measured by a spectrum analyzer with 100 kHz resolution bandwidth.

Figure 1D:
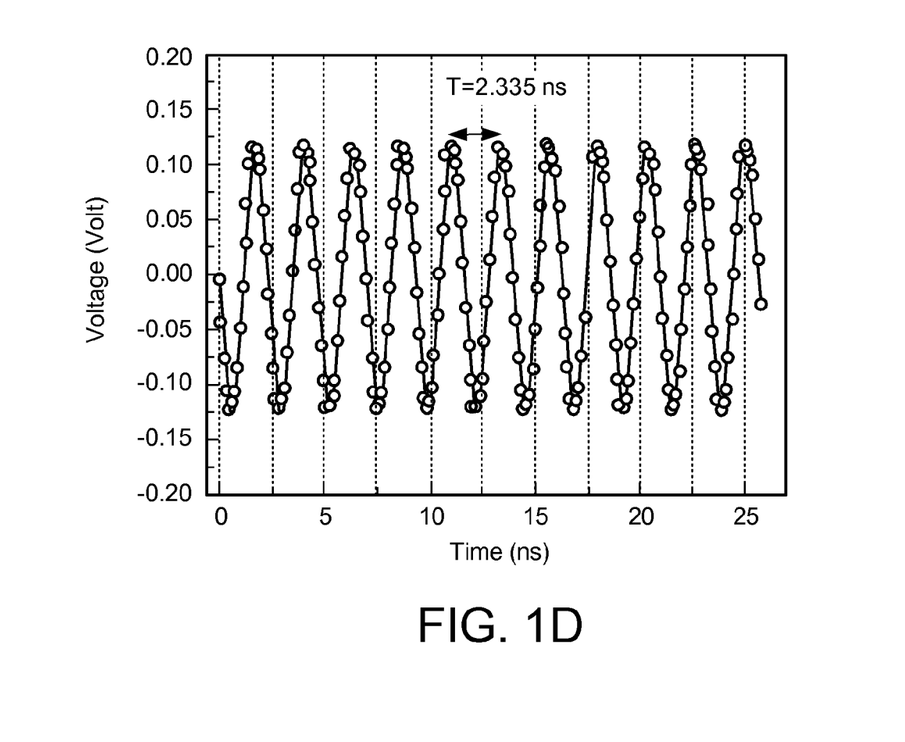

FIG. 1D illustrates a clean, stable, sinusoidal time-domain output waveform of the NEMS oscillator, measured by a high-speed oscilloscope.

Thus, as depicted in FIG. 1A, a self-sustaining oscillator 100 outputs coherent periodic (of particular interests, RF) signals 106 while it only needs a DC power supply 108. One may attempt to replace the frequency determining elements, conventionally piezoelectric crystals [15] and MEMS resonators [8, 12], with a high-Q (quality factor) NEMS resonator 110 made from single-crystal SiC. As shown in the scanning electron microscope images 104, the doubly-clamped beam resonator has been patterned and fabricated from high-quality SiC epilayer with an optimized UHF SiC NEMS process [11]. The device's mechanical resonance is excited and transduced magnetomotively [11]. The specific device has dimensions of 1.65 µm (L)×120 nm (w)×80 nm (t) (excluding the ~50 nm metallization layers on top), having its in-plane fundamental mode resonance at 428 MHz with Q~2500. While embodiments of the invention may be implemented using SiC, alternative compounds may be utilized including, but not limited to single-crystal silicon (Si), poly-Si, Silicon Nitride ($SiN_x$), Gallium Arsenide (GaAs), Aluminum Nitride (AlN), nanowires and nanotubes.

Besides high-Q nanoresonators fabrication and signal extraction, the essential challenges for creating self-sustaining oscillators with NEMS devices are how to detect large signals from the nanodevices and to subsequently process the signals. Such results have not been possible in the prior art since the transduced electrical signals have become vanishingly small for UHF NEMS resonators as the devices sizes are scaled down. Suffering from the ubiquitous embedding and parasitic background response, usually one could only achieve typical resonance signal-to-background ratio (or, on-resonance to off-resonance ratio) of ~0.1 dB or smaller in a narrow frequency band for UHF NEMS resonators [10, 11], if the signal could ever be elaborately extracted from the overwhelming background response, and even when the background responses have been suppressed by the employment of some bridge circuit [16]. Such a small signal cannot reliably perform a frequency selective function in a feedback loop. In this regard, at various frequencies where the signals have comparable levels to that at the desirable device resonance frequency, conditions for self-oscillation may be satisfied at the same time and as a result, no stable self-oscillation can be sustained. Such properties make it seemingly impossible to realize self-oscillation with UHF NEMS devices.

Figure 2:
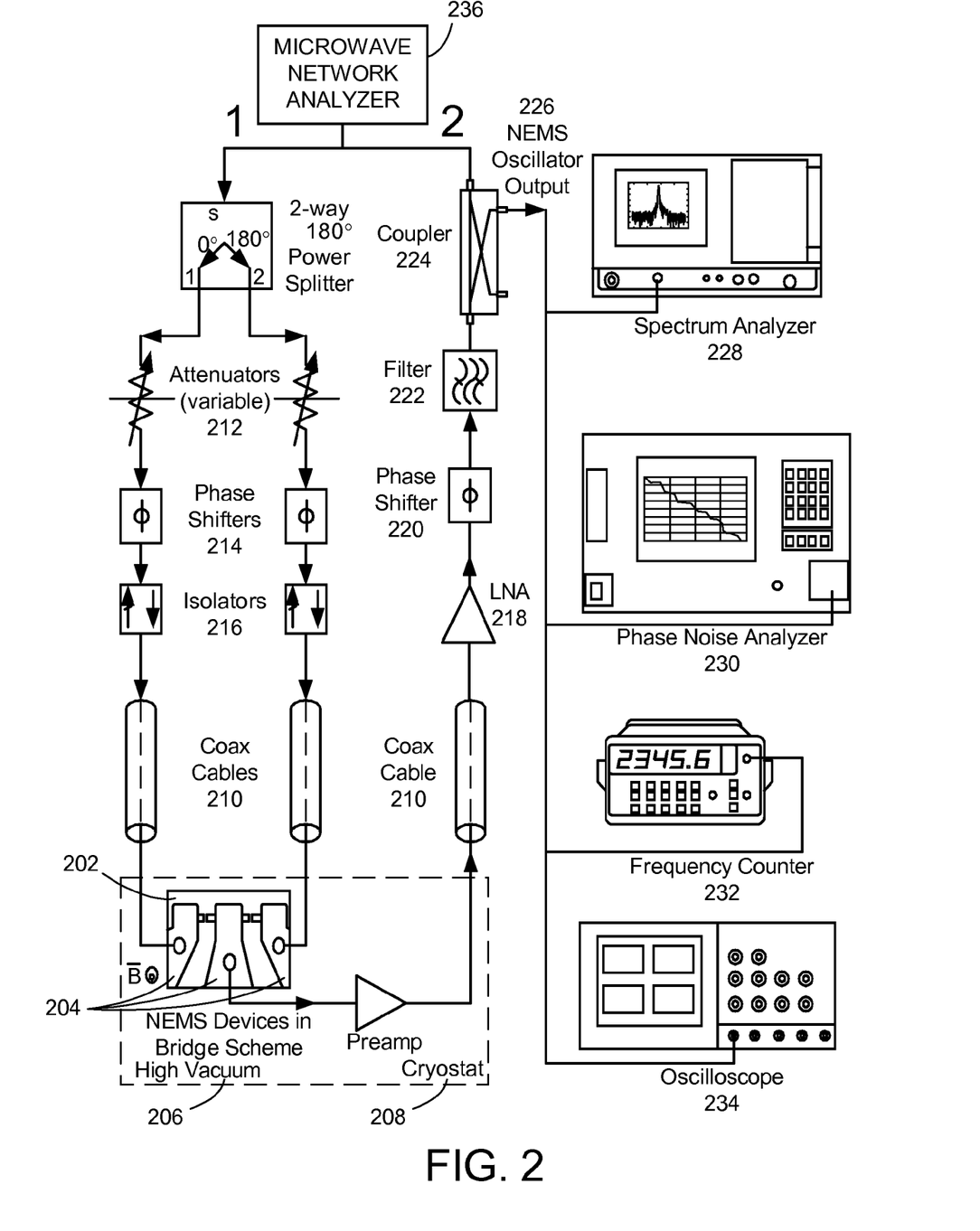
FIG. 2 illustrates a measurement setup for realizing the self-sustaining oscillation with UHF NEMS resonators in accordance with one or more embodiments of the invention.

One or more embodiments of the invention provide high-resolution matching and balancing techniques for a bridge circuit (FIG. 2), with which the background nulling is carried out much more precisely. Thus, FIG. 2 illustrates a measurement setup for realizing the self-sustaining oscillation with UHF NEMS resonators. The sample chip consists of a pair of doubly-clamped vibrating NEMS resonator devices made by a nanofabrication process for high-frequency SiC NEMS (area 202 show Al metallization of the devices and close-in via), and conducting pads defined by photolithography (areas 204, Au metallization) for wire-bonding. One of the devices in this pair determines the frequency of the oscillator and serves as the frequency reference for the self-sustaining oscillator. The other device in the pair may serve as a bridge resistor to provide the balance in the bridge circuit. The difference between the resonance frequencies of the devices is much larger than the resonance bandwidth of each of the devices. Alternatively, rather than utilizing a pair of NEMS beam resonators, a single NEMS beam resonator may be utilized. In such an embodiment, the second branch of the bridge may utilize an additional NEMS beam resonator, a nanofabricated resistor, or another similar component. Further, while the invention described herein may utilize a doubly-clamped beam resonator, a cantilevered beam may be utilized. In this regard, beams 204 represent both doubly-clamped and cantilevered beams as well as a single NEMS beam resonator or a pair of resonators.

An on-stage temperature sensor and heater for controlling the sample temperature are mounted on the backside of the sample stage. The sample is secured in a high vacuum chamber 206 ($<10^{-7}$ Torr). In the magnetomotive transduction setup, the chamber 206 is dipped into a cryostat 208 where the superconducting magnet runs and provides up to 8 Tesla strong magnetic field. The pair of NEMS devices 204 are connected to a room-temperature electronic system outside of the cryostat 208 via three coaxial cables 210 (each 6 feet long) to a balanced-bridge circuit scheme. Besides matching the impedances of the two branches, techniques including attenuation 212, phase shifting 214, and isolation 216 are all applied to each branch of the bridge to perfectly null the embedding background response (e.g., arising from parasitic effects and impendance mismatch). The feedback loop of the NEMS oscillator consists of low-noise amplifier 218, phase shifter 220, filters 222 for setting the oscillation conditions and a directional coupler 224 to facilitate the oscillator output 226 to be characterized straightforwardly.

More specifically, FIG. 2 shows the setup schematic and electric circuit diagram for realizing the NEMS oscillator and its output spectrum characterization by using a spectrum analyzer 228 (other measurements, including phase noise measurement with a phase noise analyzer 230, frequency stability measurement using a frequency counter 232, time-domain oscillation measurement with a high speed oscilloscope 234, are similar). One can realize the self-sustaining NEMS oscillator based on the large-signal readout of the NEMS resonance by using a high-resolution balanced-bridge scheme. The new high-resolution bridge scheme has evolved from a prototype of a bridge circuit but has unprecedented balancing resolution and background-nulling performance. To realize oscillation with a NEMS resonator, a large resonance signal (usually can be characterized by resonance signal-to-background ratio (RSBR), in dB, equivalent to the on-resonance to off-resonance ratio used in some other communities) in an adequate frequency span (e.g. at least 5~10% of the resonance frequency) is crucial. Based on analyzing and simulating how to minimize the background signal arising from the mismatch, reflection, dispersion, etc., tunable techniques have been applied including impedance matching, isolation 216, phase shifting 214, attenuation 212, etc., to perfectly match the two branches and null out the background, and thus maximizing RSBR.

As shown in FIG. 2, the NEMS resonance detection is implemented and optimized in an open loop by connecting a microwave network analyzer 236 (HP 8720C) between nodes 1 and 2 for two-port measurement. The loop gain and loop phase-change are measured in this open loop setup. Then the feedback branch of the circuit is designed to satisfy the Barkhausen criteria for oscillation (see FIG. 3). The loop is closed by feeding back output 226 to input (connecting points 1 and 2) and the oscillation with NEMS resonator is realized. In stable oscillation, the only input to the system is the DC power supply for the sustaining amplifiers and the output radio-frequency signal can be straightforwardly characterized.

Figure 3:
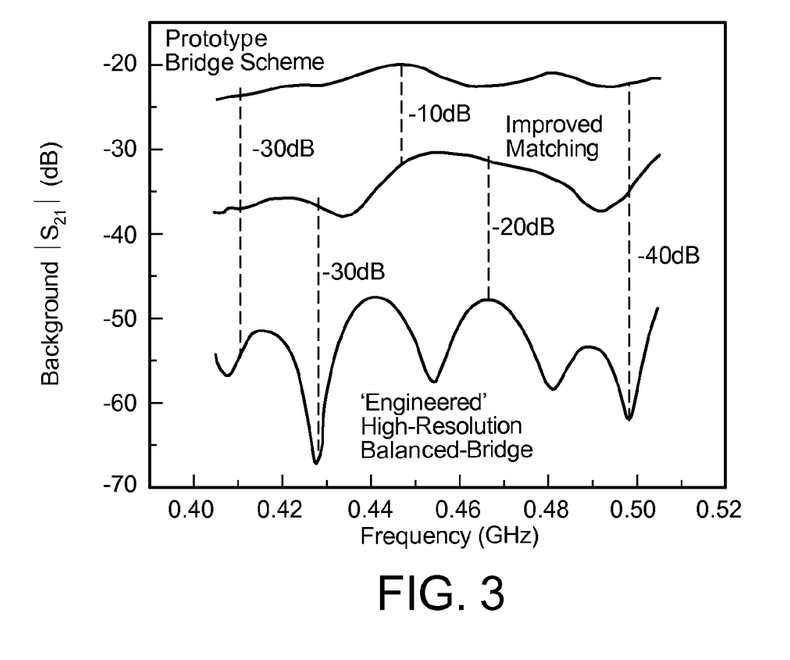
FIG. 3 illustrates background suppression by high-resolution bridge-balancing and nulling techniques in accordance with one or more embodiments of the invention.
Figure 4A:
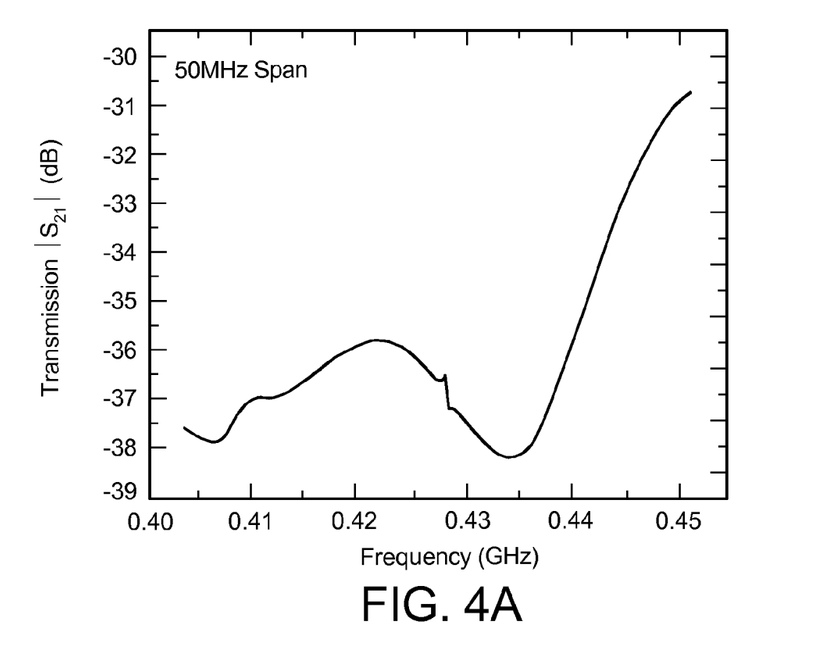
FIGS. 4A-4C illustrate the significant enhancement of RSBR with the use of high-resolution bridge-balancing and background-nulling techniques in accordance with one or more embodiments of the invention.
Figure 4B:
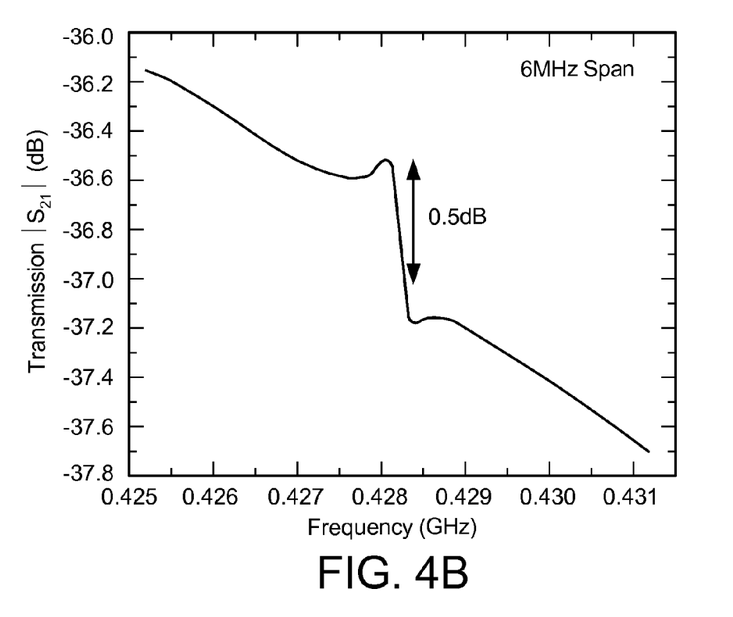
Figure 4C:
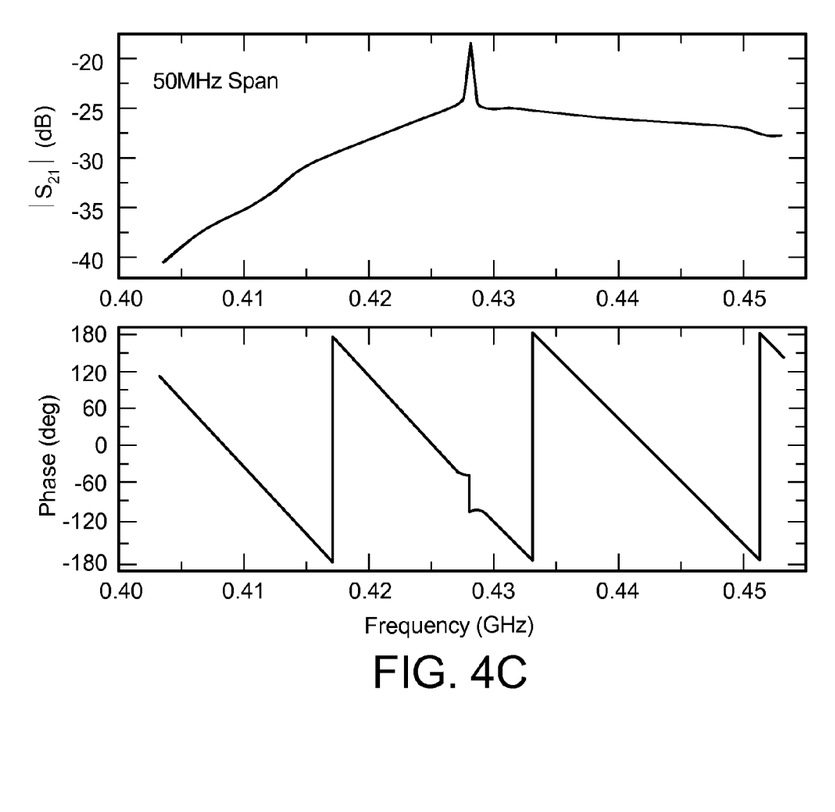

Accordingly, off-resonance background response (ideally a virtual ground but in reality a frequency-dependent background) is nulled to unprecedented levels, further suppressed by 50~60 dB compared to that of the prototype bridge circuit without high resolution balancing. FIG. 3 illustrates background suppression by high-resolution bridge-balancing and nulling techniques. As illustrated, over 100 MHz frequency span, 30~40 dB background suppression has been achieved. In this regard, FIG. 3 shows the detected background response in a very wide frequency range (100 MHz) by using the prototype bridge scheme, one with relatively-lower-resolution magnitude and phase control, and the best engineered high-resolution balancing and nulling scheme, respectively. The background suppressing effect is striking, with 30~40 dB improvement throughout this wide band. This effect immediately gains the significant increase of RSBR, as shown in FIGS. 4A-4C. Direct readout typically yields ~0.1-0.5 dB by using prototype bridge scheme or lower-resolution balancing, while the high-resolution scheme attains typically 5~10 dB RSBR($\omega_0$), as shown in FIG. 4C, which is the signal promising for having frequency selection functionality and realization of self-sustaining oscillation.

Thus, FIGS. 4A-4C illustrate the significant enhancement of RSBR with the use of high-resolution bridge-balancing and background-nulling techniques. FIGS. 4A and 4B illustrate the 428 MHz resonance signal read out by using an earlier version of bridge scheme, with RSBR of the order ~0.1-0.5 dB. As shown, self-oscillation is impossible to be realized. FIG. 4C illustrates the 428 MHz resonance signal from the high-resolution balanced-bridge scheme, with typical ~8-10 dB RSBR, and over very wide band. Such a scheme provides for frequency selection capability by a resonator to achieve self-sustaining oscillation.

In view of the above, in FIG. 3, the practical limits of nulling parasitic background are approached. Thus, in accordance with embodiments of the invention, one may read out UHF NEMS resonance signals with signal-to-background ratio of 5~10 dB in a wide band (FIG. 4A-4C), comparable to signal levels from much larger MEMS and bulk crystal resonators [12, 17], indicating a profound improvement in the UHF NEMS signal detection. Using this scheme with a microwave spectrum analyzer 236, FIG. 1B illustrates the measured resonance signal of the 428 MHz NEMS, 8 dB above the background in a wide band.

Retrieving large resonance signal over a wide band makes it possible to use nanoresonators for frequency reference and selection. To attain self-oscillation in a closed loop, at the selected frequency, the overall loop response should satisfy the Barkhausen criteria [4, 12], i.e., loop gain $|H(\omega)| \geq 1$ (0 dB) and loop phase change $\phi[H(\omega)] = 2n\pi$, with n an integer, where $H(\omega)$ is the frequency-dependent loop transfer function. One can first perform open loop calibration in the network analysis mode, to precisely tune the open loop gain and phase change to meet the Barkhausen criteria. Then in the oscillator mode, the network analyzer 236 is removed and the feedback loop is closed to attain stable self-oscillation. One compelling characteristic of the NEMS oscillator is, in its closed-loop mode, once the Barkhausen criteria is satisfied at the resonance peak, the stable oscillation is easily switched on/off by simply turning on/off the DC power supply for the sustaining amplifiers 218. Specifications of the oscillator system and its frequency determining element, the UHF NEMS resonator, are summarized in Table 1.

TABLE 1

Specifications of the UHF NEMS oscillator system and the embedded nanomechanical resonator.

| Spec | Value |
| --- | --- |
| Device Length | 1.65 µm |
| Device Thickness | 80 nm |
| Device Width | 120 nm |
| Resonance $f_0$ | 428.2 MHz |
| Device Mass | 55.5 fg |
| $S_{x,th}^{1/2}$ (device) | 1.64 fm/√Hz |
| $S_{v,th}^{1/2}$ (device) | $3.05 \times 10^{-11}$ volt/√Hz |
| DR (device) (intrinsic, 1 Hz ENBW) | 114.1 dB |
| $S_{v,real}^{1/2}$ (system, preamp) | $2.38 \times 10^{-10}$ volt/√Hz |
| DR (used, measured) | 96.3 dB |
| Signal-to-Background Ratio | 8 dB |
| Output Power | 3.2 mWatt (5 dBm) |

NEMS Oscillator Performance and Discussions

In its self-oscillating mode, the NEMS oscillator is readily characterized. FIG. 1C shows a representative measured power spectrum at the output of the NEMS oscillator. The output peak power is 5 dBm (i.e., 3.2 mWatt RF power, or equivalently, 0.405 Volt for 50Ω standard). FIG. 1D shows the time-domain stable oscillation waveforms measured by a fast oscilloscope.

This stable self-sustaining oscillator greatly facilitates the study of phase noise and sensitivity of the UHF NEMS resonator-embedded system, since noise and sensitivity are both crucial for communications and sensors applications, and the trade off is, the smaller and more sensitive the device, the more susceptible it is to noise. Of practical importance, low phase noise is desirable for UHF signal processing and communications [4, 12, 17, 18], and sensitivity is most essential for transducers applications such as mass sensors [19, 20].

Figure 5A:
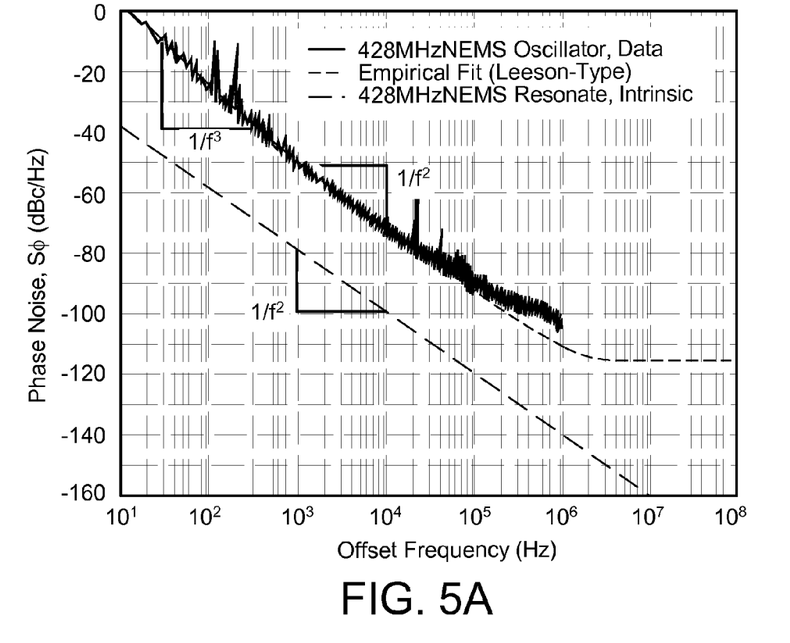
FIGS. 5A-5B illustrate NEMS oscillator phase noise performance in accordance with one or more embodiments of the invention.
Figure 5B:
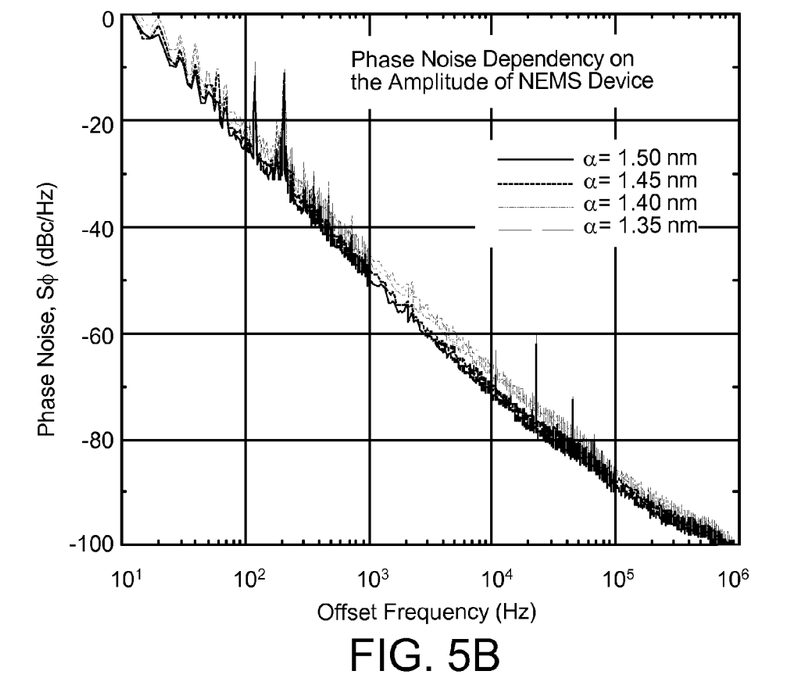

Measured phase noise performance of the oscillator system is shown in FIGS. 5A and 5B. As shown in FIG. 5A, the measured phase noise spectrum of the prototype UHF NEMS oscillator closely follows a $1/f^2$ power law in the 300 Hz-1 MHz offset frequency range. This indicates that phase noise in this regime originates predominantly from fluctuating sources with white spectra [4, 21]. In the present case these are largely the electronic thermal noise from the NEMS displacement transducer and its readout amplifier. Close in to the resonance peak frequency (carrier), we observe phase noise exhibiting $1/f^3$ behavior. This is consistent with the $1/f$ (flicker) noise mechanisms expected in this regime. As FIG. 3 displays, we find that an empirical fit to a Leeson-type model [4, 22] (i.e., $$S_\phi = 10\log\left[\frac{2F_n k_B T}{P_C} \cdot \left(1 + \frac{f_0}{2Qf}\right)^2 \left(1 + \frac{f_{1/f^3}}{f}\right)\right]$$

agrees very well with the measured phase noise data, yielding an equivalent noise factor of $F_n=1.4$ and corner (knee) offset frequency for $1/f^3$ phase noise (i.e., $1/f$ frequency noise) of $f_{1/f^3} \approx 300$ Hz. The theoretical analysis of phase noise (shown in FIG. 5A) illustrates that the thermal noise and $1/f$ noise from the oscillator electronics, rather than the intrinsic noise from the NEMS resonator itself, dominates; and this agrees well with the measured data.

The ultimate limits of phase noise performance will be imposed by the NEMS resonator's intrinsic thermomechanical fluctuations [23]. The corresponding phase noise in this limit is $$S_\phi = 10\log\left[\frac{k_B T}{2P_C Q^2} \cdot \left(\frac{f_0}{f}\right)^2\right],$$

which is also displayed in FIG. 5A. Here $k_B$ is the Boltzmann constant and T the temperature.

The dynamic range of the NEMS device itself is 114.1 dB (determined by the onset of its nonlinear behavior and its thermomechanical noise for 1 Hz noise bandwidth [24]), while the real system attains an effective dynamic range of 96.3 dB. The smaller-than-ideal dynamic range is due to the fact that while the UHF NEMS device's thermomechanical resonance generates an electromagnetomotive voltage spectrum density of ~0.0305 nV/√Hz, the noise floor of the readout electronic system is ~0.238 nV/√Hz. The agreement between the experimental results and the theory clearly validates the strategy of projecting a path to noise performance optimization of the NEMS oscillator based on the theory. By approaching the thermomechanical noise floor of NEMS resonators, competing with or even winning over conventional bulky crystal oscillators is possible.

FIG. 5B shows the measured phase noise when the UHF NEMS device is driven at difference level to assume different vibrating amplitudes in the self-oscillating mode. It demonstrates decreased phase noise as the NEMS resonator is driven to larger amplitudes but still in its mechanical dynamic range (here a small increment is used in increasing the drive in order to make sure all the levels are still well in the dynamic range). This is reasonable, as the phase noise is expected to decrease as more power is driven into the NEMS resonator.

Accordingly, FIGS. 5A-5B illustrate NEMS oscillator phase noise performance. In FIG. 5A, phase noise of the NEMS oscillator is measured for offset frequency from 10 Hz to 1 MHz, with a specialized phase noise analyzer. Shown are the measured data, the theoretical prediction based on oscillator phase noise theory [4, 21, 22], and the calculated ultimate phase noise performance determined by the NEMS resonator device itself [23], which could be achieved if the transduction and feedback electronics is ideally noise-matched to the NEMS device. The agreement between the phase noise theoretical prediction and the measurement clearly verifies that in the present NEMS oscillator the phase noise is limited by the thermal noise of the electronics, thus providing guidelines for further optimization and engineering of the NEMS oscillator. In FIG. 5B, phase noise measured at different drive levels, showing that within the dynamic range of the NEMS device, the higher the drive, the lower the phase noise.

Figure 6A:
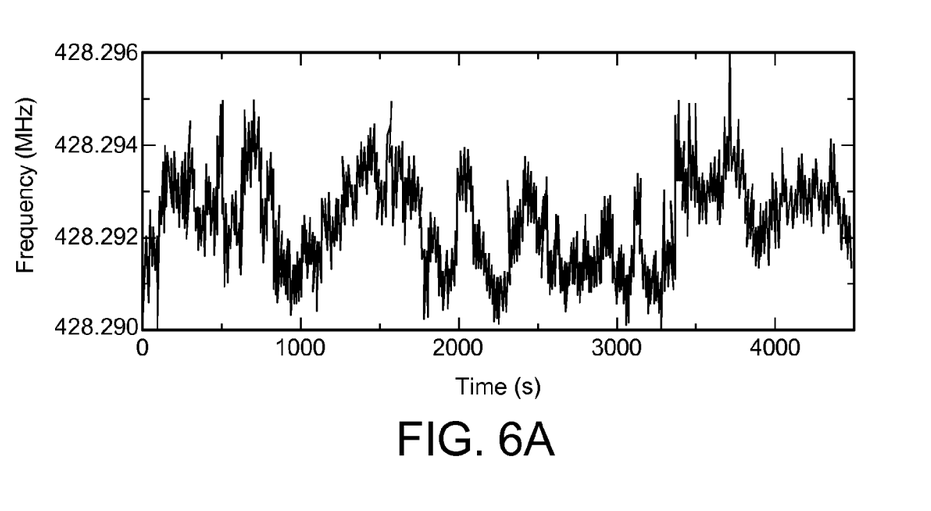
FIGS. 6A-6B illustrate NEMS oscillator frequency stability in accordance with one or more embodiments of the invention.
Figure 6B:
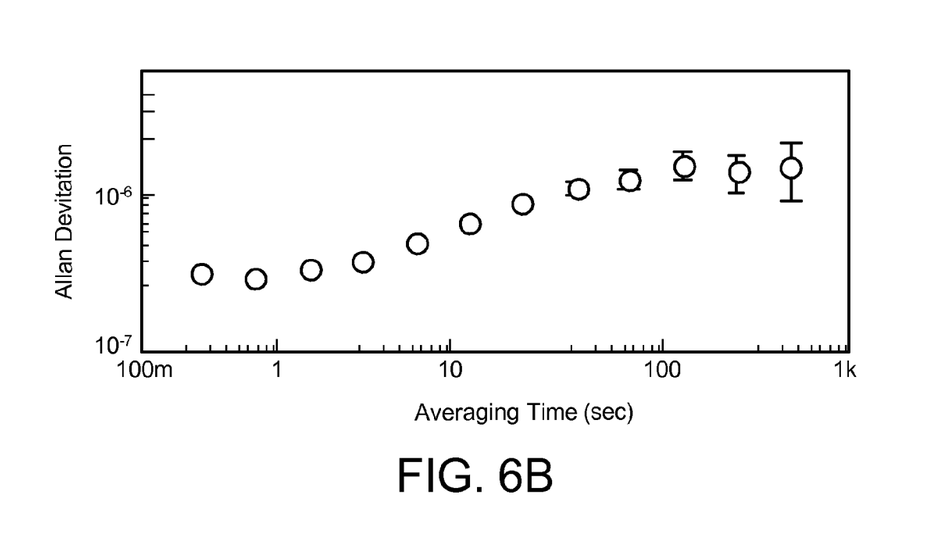

Time domain frequency stability is another crucial specification and measured data are shown in FIGS. 6A and 6B. The NEMS oscillator's instantaneous output oscillating frequency is recorded with a high-precision counter in real-time (FIG. 6A). FIG. 6B demonstrates the Allan deviation as a function of averaging time, the deviation of the fractional frequency fluctuation of an oscillator and a standard metrics for characterizing the frequency stability of an oscillator [25], $$\sigma(\tau) = \sqrt{\frac{1}{2(N-1)} \sum_{i=1}^{N} \left( \frac{\overline{f}_{i+1} - \overline{f}_i}{f_0} \right)^2},$$

where $f_0$ is the carrier frequency, and $\overline{f}_i$ is the measured (averaged) frequency in the ith time interval. The measured Allan deviation versus averaging time shows similar characterizations with those of crystal oscillators and other time standards [26], with the optimized value of $3.0 \times 10^{-7}$ at 0.2-1 sec averaging time. This level of frequency stability directly translates into a real-time mass sensitivity of ~50 zg, given the UHF NEMS device's ultrasmall mass and ultrahigh mass responsivity [19, 20]. Compared to the alternative scheme for real-time mass sensing by incorporating VHF/UHF NEMS resonators into low-noise phase-locked loops [20, 27], the NEMS oscillator provides much wider band operations and does not need an external more stable active oscillator to drive the passive NEMS resonator device, while completely allowing self-oscillating and self-sensing. This uniqueness is even more remarkable for arrays of NEMS sensors, where arrays of engineered NEMS oscillators work as independent sensors and their self-sensing signals, each from an individual oscillator's RF output, can be retrieved, recorded, and processed in parallel at the same time. This indicates a great advantage over the cantilever static deflection measurements with optical techniques [28, 29] for arrays of sensors where the real-time dynamic response from sensors could not be detected concurrently.

Accordingly, FIGS. 6A-6B illustrate NEMS oscillator frequency stability. FIG. 6A shows instantaneous oscillating frequency of the NEMS oscillator output, measured by a precise counter in real-time, for a time interval of longer than one hour. FIG. 6B shows Allan deviation of the NEMS oscillator, showing a typical behavior of a crystal oscillator, with a minimum of $\sim 3.0 \times 10^{-7}$ for 0.2-1 sec averaging time. This means that for 1 sec interval, the NEMS oscillator's fractional frequency fluctuation is smaller than 0.5 ppm. The data also shows that the maximum observed frequency instability is just about 1 ppm, even for intervals as long as 10 minutes to ~1 hour.

Satisfying Oscillation Conditions and Optimization

The Barkhausen criteria for self-oscillation is the loop gain and loop phase-change satisfy the following conditions $|H(\omega)| \leq 1 (0\, dB)$, and $\phi[H(\omega)] = 2n\pi$, where n is an integer. In open loop measurements, the loop gain and loop phase-change are calibrated and then adjusted to satisfy these conditions for oscillation. When the loop is closed, due to the inevitable reflection and phase change, the real (closed-loop) values of loop gain and loop phase-change can be slightly different but the oscillation conditions can be restored by minor adjustments which make up the slight changes due to the closing loop action.

Figure 7A:
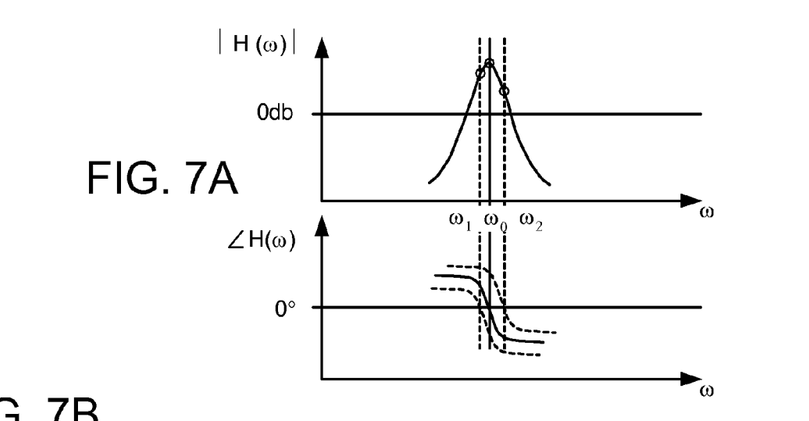
FIG. 7A illustrates a schematic of satisfying the Barkhausen criteria for self-oscillation and optimizing the NEMS output by tuning loop phase shift in accordance with one or more embodiments of the invention.

FIG. 7A illustrates a schematic of satisfying the Barkhausen criteria for self-oscillation and optimizing the NEMS output by tuning loop phase shift. As illustrated, when the loop gain is tuned to allow loop gain $|H(\omega)| \leq 1$ in the frequency range of $(\omega_1 = \omega_0 - \delta_1, \omega_2 = \omega_0 + \delta_2)$ $(\delta_1, \delta_2 << \omega_0/Q)$, the loop phase-change can be tuned such that at some certain frequency $\omega \epsilon (\omega_0 - \delta_1, \omega_0 + \delta_2)$, the Barkhausen criteria are met and self-oscillation is attained.

Figure 7B:
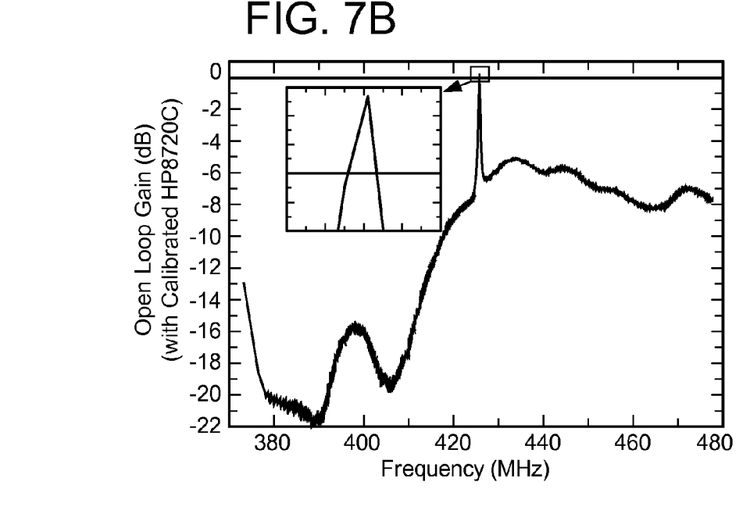
FIG. 7B illustrates loop gain measurement (in open loop scenario) for setting the oscillation condition at the vicinity of peak of the resonance signal in accordance with one or more embodiments of the invention.
Figure 7C:
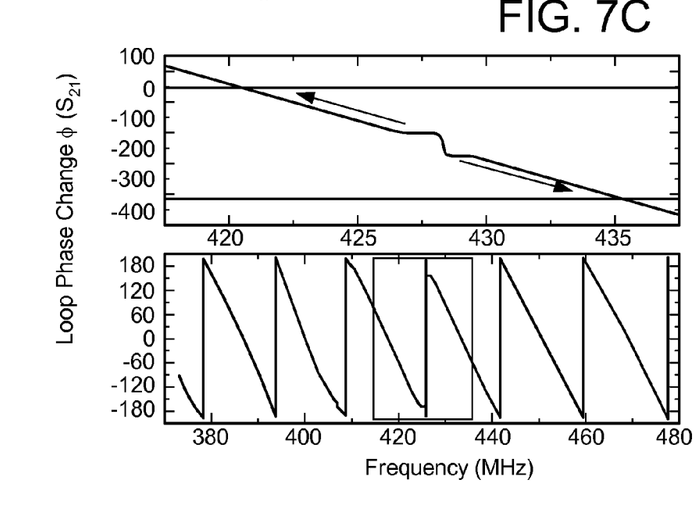
FIG. 7C illustrates measured loop phase-change (in open loop scenario): arrows show the loop phase-change can be tuned to 0 or $2\pi$ to satisfy the self-oscillation condition in accordance with one or more embodiments of the invention.

The practical scenario of this implementation in real experiments is demonstrated by FIGS. 7B and 7C, with the measured open loop gain and open phase change, respectively. In this regard, FIG. 7B illustrates loop gain measurement (in open loop scenario) for setting the oscillation condition at the vicinity of peak of the resonance signal. FIG. 7C illustrates measured loop phase-change (in open loop scenario): arrows show the loop phase-change can be tuned to 0 or $2\pi$ to satisfy the self-oscillation condition. As shown in FIG. 7B with measured data, when the loop phase-change is tuned, the oscillation frequency can be swept within the range of $(\omega_0 - \delta_1, \omega_0 + \delta_2)$, from one side to the other side of the resonance peak frequency $\omega_0$; and the oscillator output power is also observed to go across the maximum. The frequency detuning due to loop phase-change variation is about 300 ppm/90 deg, as shown in FIG. 7C. For better stability and phase noise performance, it is desirable to tune the system to set the oscillation at the frequency of the resonance peak.

Coupled NEMS Oscillators and Voltage-Controlled NEMS Oscillators

Figure 8A:
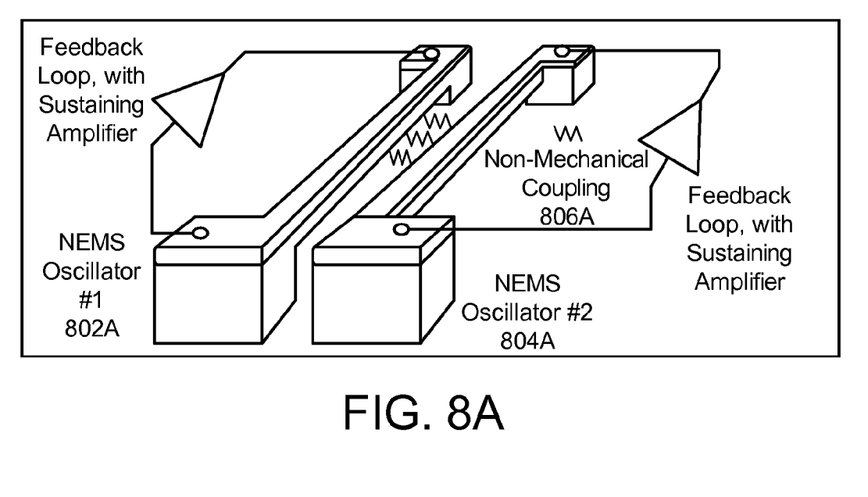
FIGS. 8A and 8B illustrate schematics and designs of coupled oscillators and voltage-controlled oscillators (VCOs) based on NEMS resonators and coupled NEMS resonators in accordance with one or more embodiments of the invention.
Figure 8B:
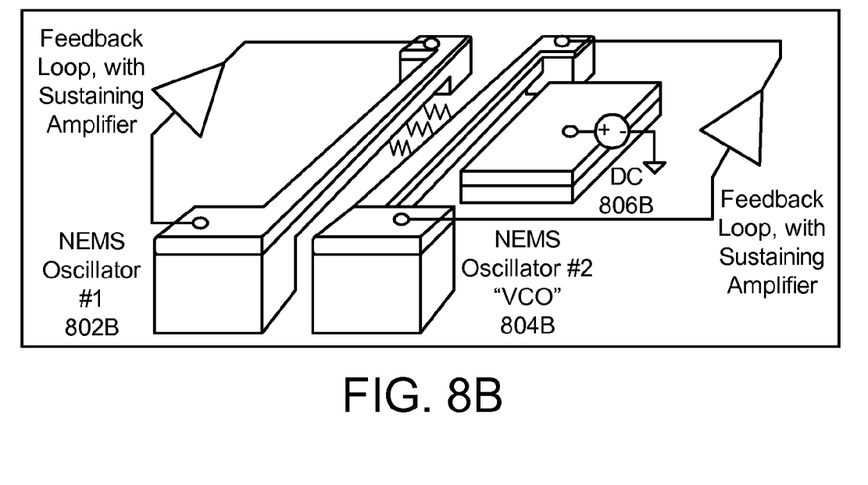

FIGS. 8A and 8B illustrate schematics and designs of coupled oscillators and voltage-controlled oscillators (VCOs) based on NEMS resonators and coupled NEMS resonators.

FIG. 8A demonstrates the designs of two self-sustaining NEMS oscillators 802A and 804A with their frequency determining NEMS resonators coupled by certain mechanisms. The illustrated coupling 806A between two similar oscillators 802A and 804A is non-mechanical but can be electrostatic, or magnetic (spin-coupled). The coupling 806A can then introduce interesting frequency tuning and pulling effects and the synchronization between the two active oscillators 802A and 804A can be tuned and realized, which is very important and interesting for signal generation, processing and pattern forming applications.

Moreover, by introducing frequency tuning via DC voltage coupling 806B to either of the NEMS resonators as shown in FIG. 8B, voltage-controlled oscillator (VCO) 804B can be realized. Meantime, the NEMS VCO functionality can be further enhanced by synchronization with another NEMS oscillator 802B or NEMS VCO 804B through coupling between the NEMS resonators.

NEMS Oscillator Arrays

Figure 9A:
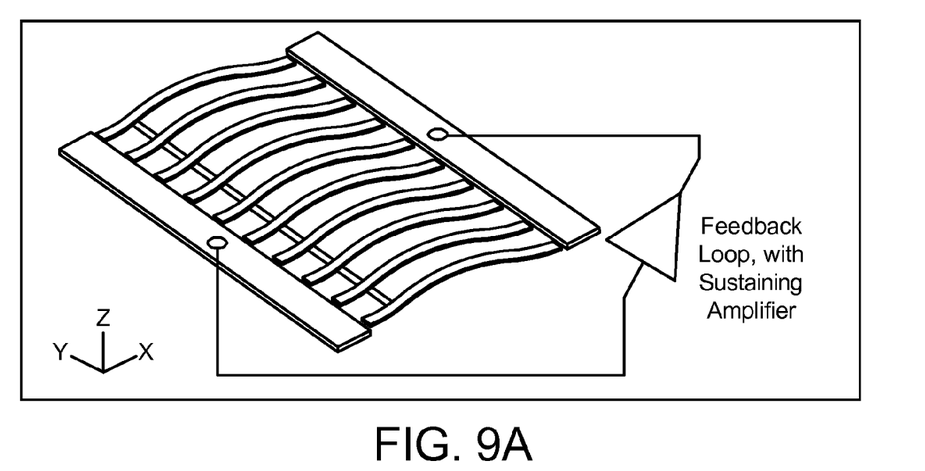
FIGS. 9A and 9B illustrate the schematics and designs of NEMS oscillators based on arrays of coupled NEMS resonators (FIG. 9A) and NEMS oscillator arrays for multiplexed signal/information processing based on arrays of NEMS resonators and their sustaining feedback loops, and the multiplexing control and interface circuits (FIG. 9B) in accordance with one or more embodiments of the invention.
Figure 9B:
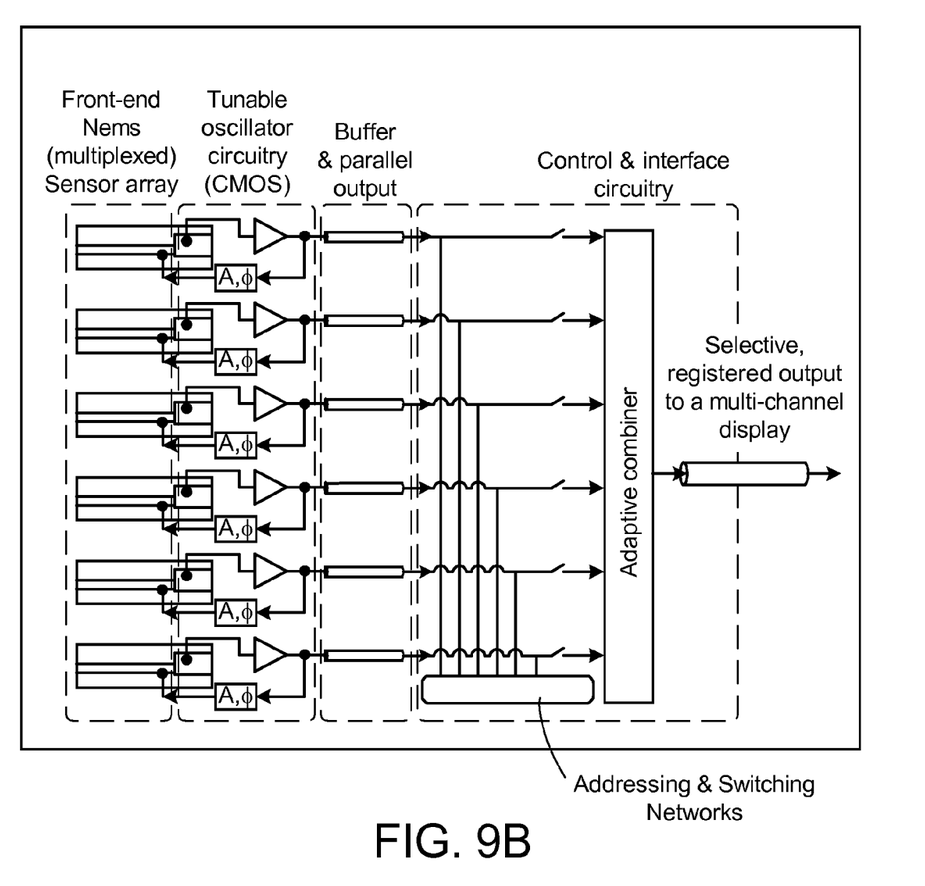

FIGS. 9A and 9B illustrate the schematics and designs of NEMS oscillators based on arrays of coupled NEMS resonators (FIG. 9A) and NEMS oscillator arrays for multiplexed signal/information processing based on arrays of NEMS resonators and their sustaining feedback loops, and the multiplexing control and interface circuits (FIG. 9B).

More specifically, FIG. 9A shows the design of self-sustaining oscillator based on an array of mechanically-coupled NEMS resonators. Mechanically-coupled arrays possess much larger signal strength and power handling capability, as compared to single resonator device. The better power handling and lower phase noise performance of such NEMS oscillators with arrayed resonators may be used for nanomechanical signal processing and communication applications.

The schematic shown in FIG. 9B demonstrates a new paradigm of multiplexed signal/information processing based on an array of self-sustaining NEMS oscillators. Each of the NEMS oscillators in the array is based on a NEMS resonator integrated with its tuned feedback circuit. As arrays of vibrating NEMS resonator devices are being batch-fabricated with growing yield, this technology may be important for real-time, multi-channel sensing and parallel signal detection technologies based on large arrays of NEMS devices.

CONCLUSION

This concludes the description of the preferred embodiment of the invention. The following describes some alternative embodiments for accomplishing the present invention.

Demonstration of NEMS oscillator clearly shows that UHF nanomechanical resonators can be embedded into feedback control circuitry to realize complex system-level functions and performances that are critical for future practical applications of nanodevices. The NEMS oscillator specifications and performance make it very attractive for ultra-sensitive transducers in a self-oscillating and self-sensing mode, with particular advantage for arrays of sensors, and also for novel measurement schemes for probing fundamental physical and biological phenomena.

The self-oscillating NEMS systems would also be useful tools for the development of new measurement paradigms for detecting nanomechanical resonators coupled to single-quanta effects [30, 31], to photons, and also to realize self-oscillating systems with ultrahigh-Q nanophotonic resonators [32]. The UHF NEMS is operating at RF power in the range of pico-watt to nano-watt, suggesting possibilities for ultrahigh density integration of arrayed sensory and signal processing systems, with modern integrated circuit technologies [33].

Accordingly, embodiments of the invention provide for an ultrahigh-frequency self-sustaining oscillator. Impedances of each branch of a balanced bridge circuit (i.e., of the oscillator) are matched and each branch is configured to null an embedding background response (e.g., using attenuation, phase shifting, and isolation). The balanced bridge circuit comprises a first vibrating nanoelectromechanical (NEMS) beam resonator (e.g., doubly-clamped, cantilevered, etc.) as part of one of the branches, wherein the first resonator determines a frequency of the oscillator's signal. The first resonator may be patterned and fabricated from an epilayer with an optimized ultrahigh frequency (UHF) NEMS process.

The oscillator further consists of a feedback loop for setting oscillation conditions of the oscillator's signal. The feedback loop connects an output of the first resonator to an input of the balanced bridge circuit. The feedback loop may include an amplifier for amplifying the oscillator's signal output from the first resonator, and a DC power supply that sustains the amplifier. The feedback loop may further include a phase shifter for shifting the phase of the amplified oscillator signal, a filter for filtering the signal (and setting oscillation conditions), and a directional coupler to facilitate an output of the oscillator's signal.

To calibrate the oscillator, a network analyzer may be used to perform open loop calibration to precisely tune an open loop gain and phase change to meet Barkhausen criteria. Subsequent to calibration, the network analyzer may be removed to attain stable self-oscillation.

In addition to the above, non-mechanical coupling may be used to couple the first resonator to a second vibrating NEMS beam resonator of a second ultra-high frequency self-sustaining oscillator, to synchronize the oscillator to the second oscillator. Further, DC voltage may be coupled to the first resonator to enable a voltage-controlled oscillator. Alternatively, mechanical coupling may be used to couple the first resonator in an array of vibrating NEMS beam resonators. In such an embodiment, the resonators enable real-time, multi-channel sensing and parallel signal detection.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[1] e.g. S. M. Reppert, D. R. Weaver, *Nature* 418, 935 (2002).
[2] e.g. E. Celik, D. Rockwell, *Phys. Fluids* 14, 4444 (2002).
[3] e.g. M. A. Andronow, *Comptes rendus de l'Académie des Sciences* 189, 559 (1929).
[4] A. Hajimiri, T. H. Lee, *The Design of Low Noise Oscillators*, Boston: Kluwer (1999).
[5] M. D. Ward, D. A. Buttry, *Science* 249, 1000 (1990).
[6] S. Knappe et al, *Appl. Phys. Lett.* 85, 1460 (2004).
[7] R. J. Thompson, Jr., *IEEE Trans. Ultrason. Ferroelect. & Freq. Cont.* 52, 694 (2005).
[8] C. T. C. Nguyen, *IEEE Trans. Microwave Theory & Techniques* 47, 1486 (1999).
[9] W. E. Newell, *Science* 161, 1320 (1968).
[10] X. M. H. Huang et al. *Nature* 421, 496 (2003).
[11] X. M. H. Huang et al. *New J. Phys.* 7, 247 (2005).
[12] Y. W. Lin et al., *IEEE J. Solid-State Circuits* 39, 2477 (2004).
[13] A. Husain et al., *Appl. Phys. Lett.* 83, 1240 (2003).
[14] V. Sazonova et al., *Nature* 431, 284 (2004).
[15] L. L. Lewis, *Proc. IEEE* 79, 927 (1991).
[16] K. L. Ekinci et al., *Appl. Phys. Lett.* 81, 2253 (2002).
[17] J. Wang, Z. Ren, C. T. C. Nguyen, *IEEE Trans. Ultrason. Ferroelect. & Freq. Cont.* 51, 1607 (2005).
[18] J. R. Vig, Y. Kim, *IEEE Trans. Ultrason. Ferroelect. & Freq. Cont.* 46, 1558 (1999).
[19] K. L. Ekinci, Y. T. Yang, M. L. Roukes, *J. Appl. Phys.* 95, 2682 (2004).
[20] Y. T. Yang et al, *Nano Lett.* 6, 583 (2006).
[21] D. Ham, A. Hajimiri, *IEEE J. Solid-State Circuits* 38, 407 (2003).
[22] D. B. Leeson, *Proc. IEEE* 54, 329-330 (1966).
[23] A. N. Cleland, M. L. Roukes, *J. Appl. Phys.* 92, 2758-2769 (2002).
[24] H. W. C. Postma et al., *Appl. Phys. Lett.* 86, 223105 (2005).
[25] D. Allan, *Proc. IEEE* 54, 221 (1966).
[26] S. R. Stein, J. R. Vig, in *The Froelich-Kent Encyclopedia of Telecommunications*, Vol. 3 (Froehlich, F. E. and Kent, A. eds.), Marcel Dekker, inc., New York, pp. 445-500 (1992). Or, "*Frequency Standards for Communications*," as U.S. Army Laboratory Command Technical Report SLCET-TR-91-2 (Rev. 1), NTIS Accession No. AD-A243211 (October 1991).
[27] X. L. Feng, Ph.D. Thesis, California Institute of Technology (2006).
[28] G. H. Wu et al, *Nat. Biotech* 19, 856 (2001).
[29] R. Mckendry et al., *Proc. Nat. Acad. Sci.* 99, 9783 (2002). N. Beckmann, et al., *Proc. Nat. Acad. Sci.* 102, 14587 (2005).
[30] M. D. LaHaye et al, *Science* 304, 74 (2004).
[31] K. C. Schwab, M. L. Roukes, *Phys. Today* 36-42 (July 2005
[32] H. Rokhsari et al., *Opt. Exp.* 13, 5293 (2005).
[33] A. Hajimiri et al., *Proc. IEEE* 93, 1637 (2005).

What is claimed is:

1. An ultra-high frequency self-sustaining oscillator, comprising:
   (a) a balanced bridge circuit wherein:
      (i) impedances of each branch of the balanced bridge circuit are matched and each branch is configured to null an embedding background response; and
      (ii) the balanced bridge circuit comprises a first vibrating nanoelectromechanical system (NEMS) beam resonator as part of one of the branches, wherein the first resonator determines a frequency of the ultra-high frequency (UHF) self-sustaining-oscillator's signal; and
   (b) a feedback loop, for setting oscillation conditions of the oscillator's signal, wherein the feedback loop connects an output of the first resonator to an input of the balanced bridge circuit.

2. The oscillator of claim 1, wherein the first resonator is patterned and fabricated from an epilayer with an optimized ultrahigh frequency (UHF) NEMS process.

3. The oscillator of claim 1, wherein the balanced bridge circuit is configured to null the embedding background using attenuation, phase shifting, and isolation.

4. The oscillator of claim 1, wherein the feedback loop comprises:
   an amplifier for amplifying the oscillator's signal output from the first resonator; and
   a DC power supply that sustains the amplifier.

5. The oscillator of claim 4, wherein the feedback loop further comprises:
   a phase shifter for shifting the phase of the amplified oscillator signal;
   a filter for setting oscillation conditions; and
   a directional coupler to facilitate an output of the oscillator's signal.

6. The oscillator of claim 1, further comprising a network analyzer used to perform open loop calibration of the oscillator to precisely tune an open loop gain and phase change to meet Barkhausen criteria, wherein the network analyzer is removed subsequent to calibration to attain stable self-oscillation.

7. The oscillator of claim 1, further comprising non-mechanical coupling to couple the first resonator to a second vibrating NEMS beam resonator of a second ultra-high frequency self-sustaining oscillator, to synchronize the oscillator to the second oscillator.

8. The oscillator of claim 7, further comprising DC voltage coupling to the first resonator to enable a voltage-controlled oscillator.

9. The oscillator of claim 1, further comprising mechanical coupling to couple the first resonator in an array of vibrating NEMS beam resonators, wherein the array of resonators enable real-time, multi-channel sensing and parallel signal detection.

10. The oscillator of claim 1, wherein the first resonator comprises a doubly clamped resonator.

11. The oscillator of claim 1, wherein the first resonator comprises a cantilevered resonator.

12. A method for outputting an oscillator signal in an ultra-high frequency self-sustaining oscillator, comprising:
   matching impedances of each branch of a balanced bridge circuit, wherein each branch is configured to null an embedding background response;
   determining a frequency of the ultra-high frequency self-sustaining oscillator's signal using a first vibrating nanoelectromechanical system (NEMS) beam resonator as part of one of the branches of the balanced bridge circuit; and
   setting oscillation conditions of the oscillator's signal using a feedback loop, wherein the feedback loop connects an output of the first resonator to an input of the balanced bridge circuit.

13. The method of claim 12, wherein the first resonator is patterned and fabricated from an epilayer with an optimized ultrahigh frequency (UHF) NEMS process.

14. The method of claim 12, wherein the balanced bridge circuit is configured to null the embedding background using attenuation, phase shifting, and isolation.

15. The method of claim 12, wherein the oscillation conditions are set by:
   amplifying, using an amplifier, the oscillator's signal output from the first resonator; and
   sustaining the amplifier using a DC power supply.

16. The method of claim 15, wherein the oscillation conditions are set by:
   shifting, using a phase shifter, the phase of the amplified oscillator's signal;
   filtering the oscillator's signal; and
   facilitating an output of the oscillator's signal using a directional coupler.

17. The method of claim 12, further comprising:
   calibrating the oscillator by performing open loop calibration, using a network analyzer, to precisely tune an open loop gain and phase change to meet Barkhausen criteria; and
   removing the network analyzer subsequent to calibration to attain stable self-oscillation.

18. The method of claim 12, further comprising synchronizing the oscillator to a second oscillator by coupling, using non-mechanical coupling, the first resonator to a second vibrating NEMS beam resonator of a second ultra-high frequency self-sustaining oscillator.

19. The method of claim 18, further comprising enabling a voltage-controlled oscillator by coupling DC voltage coupling to the first resonator.

20. The method of claim 12, further comprising coupling, using mechanical coupling, the first resonator in an array of vibrating NEMS beam resonators, wherein the array of resonators enable real-time, multi-channel sensing and parallel signal detection.

21. The method of claim 12, wherein the first resonator comprises a doubly clamped resonator.

22. The method of claim 12, wherein the first resonator comprises a cantilevered resonator.

* * * * *